(12) United States Patent  
Guo et al.

(10) Patent No.: US 9,195,143 B2
(45) Date of Patent: Nov. 24, 2015

(54) MASK PLATE AND EXPOSING METHOD

(71) Applicant: Beijing BOE Optoelectronics Technology Co., Ltd., Beijing (CN)

(72) Inventors: Jian Guo, Beijing (CN); Weifeng Zhou, Beijing (CN); Xing Ming, Beijing (CN); Yong Chen, Beijing (CN); Guanghui Xiao, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 182 days.

(21) Appl. No.: 13/934,663

(22) Filed: Jul. 3, 2013

(65) Prior Publication Data

US 2013/0293866 A1 Nov. 7, 2013

Related U.S. Application Data

(62) Division of application No. 13/105,110, filed on May 11, 2011, now Pat. No. 8,502,956.

(30) Foreign Application Priority Data

May 14, 2010 (CN) .......................... 2010 1 0175938

(51) Int. Cl.
*G03F 7/22* (2006.01)
*G03F 7/20* (2006.01)
(Continued)

(52) U.S. Cl.
CPC ............... *G03F 7/7015* (2013.01); *G03F 1/14* (2013.01); *G03F 1/38* (2013.01); *G03F 1/52* (2013.01); *G03F 7/70275* (2013.01); *G03F 7/70283* (2013.01); *G03F 7/70466* (2013.01)

(58) Field of Classification Search
CPC ................ G03F 1/00; G03F 7/20; G03F 7/22
USPC .................................................. 430/5; 355/75
See application file for complete search history.

(56) References Cited

U.S. PATENT DOCUMENTS 5,729,331 A  3/1998  Tanaka et al.
7,939,229 B2  5/2011  Sera et al.
(Continued)

FOREIGN PATENT DOCUMENTS

CN  101487972 A  7/2009
CN  101526754 A  9/2009

OTHER PUBLICATIONS

USPTO RR dated Dec. 6, 2012 in connection with U.S. Appl. No. 13/105,110.

(Continued)

*Primary Examiner* — Stephen Rosasco
(74) *Attorney, Agent, or Firm* — Ladas & Parry LLP

(57) ABSTRACT

A mask plate comprises a light transmitting region; a light absorbing region; and a light reflecting region provided in the light absorbing region on one side of the mask plate. An exposing method using the mask plate comprises placing a first substrate coated with a first photosensitive resist layer under and parallel to the mask plate; having first light vertically strike on an upper surface of the mask plate from above, pass through the light transmitting region of the mask plate, and strike on the first photosensitive resist layer; placing a second substrate coated with a second photosensitive resist layer under and parallel to the mask plate; and having second light reflected by the lens device onto the surface of the mask plate where the light reflecting region is provided, then reflected by the light reflecting region and strike on the second photosensitive resist layer.

3 Claims, 4 Drawing Sheets

(51) Int. Cl.
  *G03F 1/00* (2012.01)
  *G03F 1/38* (2012.01)
  *G03F 1/52* (2012.01)

(56) References Cited

U.S. PATENT DOCUMENTS

| | | | |
|---|---|---|---|
| 8,004,690 | B2 | 8/2011 | Wegmann |
| 8,778,572 | B2 * | 7/2014 | Fukuhara et al. ............ 430/5 |
| 2006/0222961 | A1 * | 10/2006 | Yan .............................. 430/5 |
| 2009/0111032 | A1 | 4/2009 | Woo |
| 2009/0263730 | A1 * | 10/2009 | Kim .............................. 430/5 |

OTHER PUBLICATIONS

USPTO Ex Parte Quayle dated Jan. 28, 2013 in connection with U.S. Appl. No. 13/105,110.
USPTO NOA mailed Apr. 4, 2013 in connection with U.S. Appl. No. 13/105,110.
USPTO NOA and Fees due dated May 23, 2013 in connection with U.S. Appl. No. 13/105,110.

* cited by examiner

MASK PLATE AND EXPOSING METHOD

BACKGROUND

Embodiments of the invention are related to an exposure apparatus, a mask plate, and an exposing method.

TFT-LCDs (Thin Film Transistor, Liquid Crystal Display) have been playing a dominant role in the current flat plate display market due to excellent characteristics, such as small capacity, low power consumption, free of radiation, and so on.

A TFT-LCD is formed by bonding an array substrate and a color filter substrate. On the array substrate, gate lines and data lines cross each other to define a plurality of pixel regions. In each pixel region, a pixel electrode and a thin film transistor are provided.

During the fabrication of the conductor lines on the array substrate of TFTs, a metal layer are firstly coated on the array substrate, then a photosensitive resist layer is coated on the metal layer, after that, the photosensitive resist layer is exposed by a mask plate, developed to form etching mask, and then removed after etching.

In the conventional exposure processes, in which there are different photosensitive resist layers to be exposed, a mask plate should be used in each exposing process to form different exposure pattern in different layers. As a result of such conventional exposure processes, the cost is high and the productivity is low.

SUMMARY

An embodiment of the present invention provides a exposure apparatus, comprising: a loading stage for supporting a substrate; a mask plate parallel to the loading stage and provided above the loading stage, the mask plate including a light transmitting region, a light absorbing region, a light reflecting region provided in the light absorbing region on a lower surface of the mask plate; a lens device provided between the mask plate and the loading stage; a first illumination light source, light from which vertically strikes on the upper surface of the mask plate from above, passes through the mask plate and strikes on the loading stage via the lens device; a light reflecting device provided in the lens device; and a second illumination light source, light from which is reflected onto the lower surface of the mask plate by the light reflecting device located in the lens device, then is reflected by the light reflecting region on the lower surface of the mask plate and strikes on the loading stage via the lens device.

Another embodiment provides a mask plate, comprising a light transmitting region; a light absorbing region; and a light reflecting region, wherein the light reflecting region is provided in the light absorbing region on one side of the mask plate.

Further another embodiment provides an exposing method by using the above mentioned mask plate, comprising: placing a first substrate coated with a first photosensitive resist layer under the mask plate, the first substrate being parallel to the mask plate; having first light vertically strike on an upper surface of the mask plate from above, pass through the light transmitting region of the mask plate, and then strike on the first photosensitive resist layer to make the first photosensitive resist layer exposed; placing a second substrate coated with a second photosensitive resist layer under the mask plate, the second substrate being parallel to the mask plate; and having second light reflected by the lens device onto the surface of the mask plate on which the light reflecting region is provided, then reflected by the light reflecting region and strike on the second photosensitive resist layer to make the second photosensitive resist layer exposed.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Hereinafter, embodiments will be described in detail with reference to the accompanying drawings so that the objects, technical solutions and advantages of the embodiments will become more apparent. It should be noted that the embodiments described below are merely a portion of but not all of the embodiments of the invention, and thus various modifications, combinations or alterations can be made on the basis of the described embodiments without departing from the spirit and scope of the invention.

Figure 1:
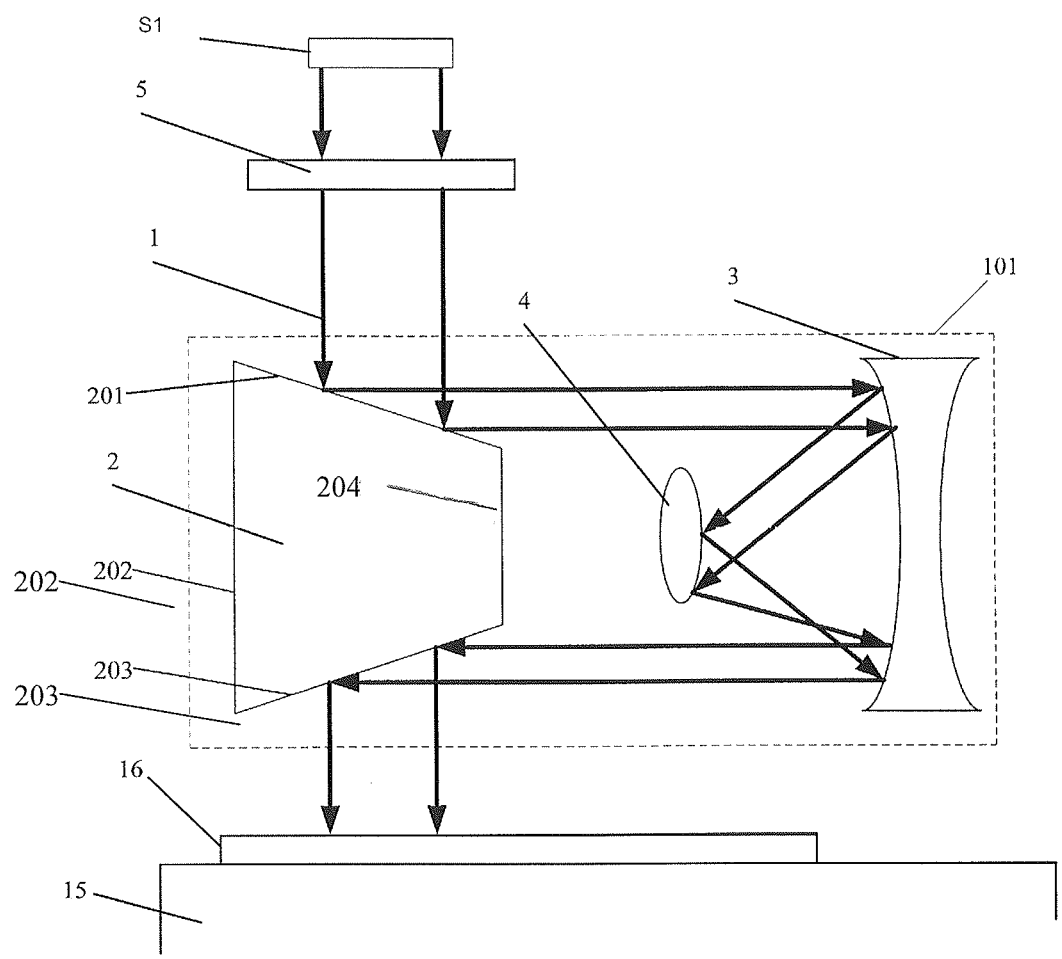
FIG. 1 is a structural schematic view showing an exposure apparatus according to an embodiment of the present invention.

As shown in FIG. 1, an exposure apparatus according to an embodiment of the present invention comprises a loading stage 15 for supporting a substrate 16; a mask plate 5 provided in parallel to the loading stage 16 and above the loading stage 15; and a lens device 101 provided between the mask plate 5 and the loading stage 15. The lens device 101 includes an isosceles trapezoid lens 2, a concave lens 3 and a convex lens 4. The isosceles trapezoid lens 2 is traverse arranged, that is to say, the upper base plane 204 and the lower base plane 202 of the isosceles trapezoid lens 2 are vertical to the mask plate 5 and the substrate 15. The concave lens 3 and the convex lens 4 are arranged on the side of the upper base plane 204 of the isosceles trapezoid lens 2. The exposure apparatus further comprises a first illumination light source S1. Light emitted from first illumination light source S1 vertically is irradiated on the upper surface of the mask plate 5 from above, passes through the mask plate 5 and is irradiated on the upper waist plane 201 of the isosceles trapezoid lens 2. The light is reflected onto the concave lens 3 by the upper waist plane 201 and transmitted to the convex lens 4 from the concave lens 3. The light reflected by the convex lens 4 is then reflected by the concave lens 3 and returns to the lower waist plane 203 of the isosceles trapezoid lens 2. After another reflection, the light reaches the loading stage 15, and on the loading stage 15, the substrate 16 having coated photosensitive resist to be exposed is exposed.

Here, the combination of the isosceles trapezoid lens 2, the concave lens 3 and the convex lens 4 can achieve function of focusing and parallel transmission. Other combination having the same function as the lens device can be used in the exposure apparatus according to the embodiment.

Figure 2:
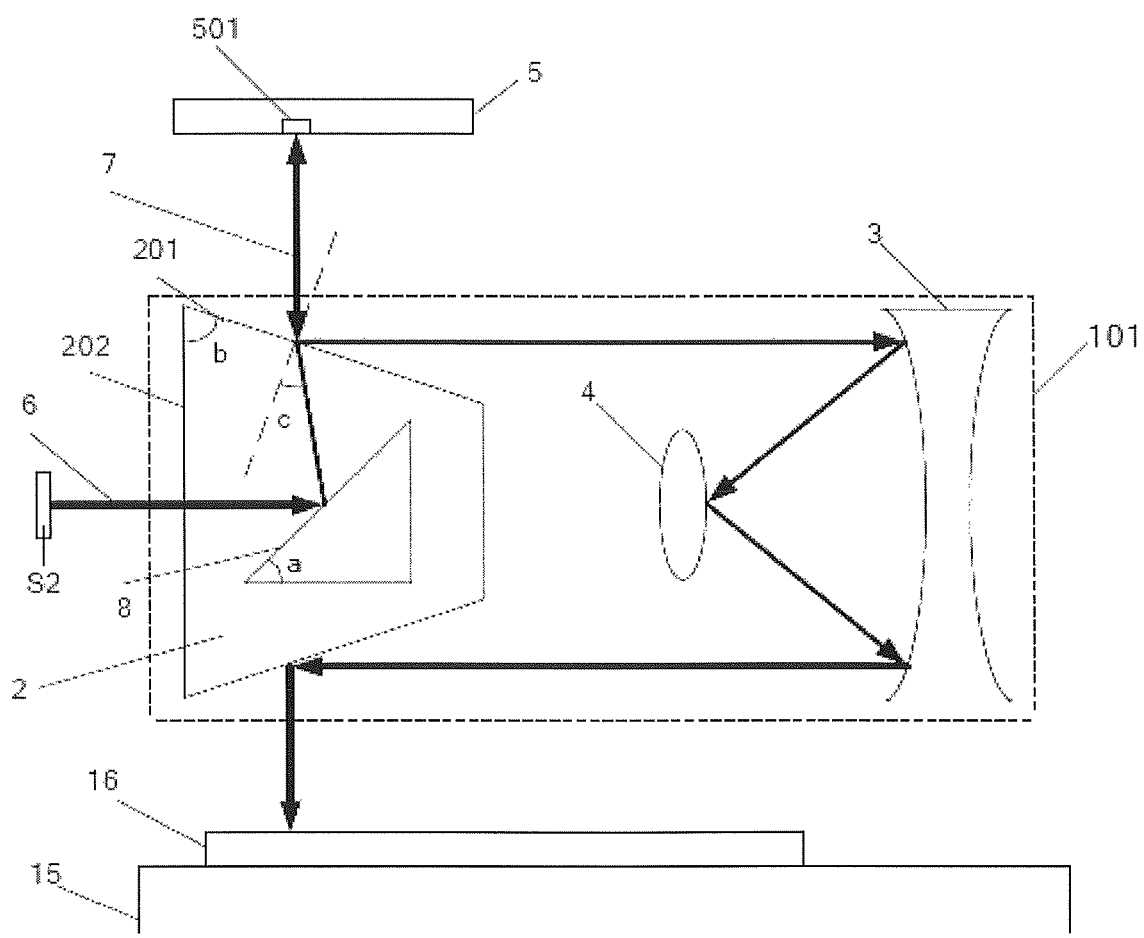
FIG. 2 is a structural schematic view showing an exposure apparatus according to anther embodiment of the present invention.

As shown in FIG. 2, the exposure apparatus of the embodiment of the present invention further comprises a light reflecting region 501 provided in the light absorbing region on the lower surface of the mask plate 5; a light reflecting device 8 provided in the lens device 101, wherein the light reflecting device 8 for example is implemented by a reflecting mirror 8 in this embodiment; and a second illumination light source S2. Light emitted by from second illumination light source S2 is irradiated on the reflecting mirror 8. Then, the light is reflected onto the upper waist plane 201 of the isosceles trapezoid lens 2 and vertically transmitted to the lower surface of the mask plate 5 through the transflective upper waist plane 201. The lower surface of the mask plate 5 includes a completely light transmitting region and a light absorbing region. There is a light reflecting region 501 in the light absorbing region. When light arrives at the lower surface of the mask plate 5, only the light 7 irradiated on the light reflecting region 501 is reflected vertically downward and then onto the concave lens 3 by the upper waist plane 201 of the isosceles trapezoid lens 2. The light 7 is finally reflected onto the loading stage 15 through the reflection path shown in FIG. 2, and then the substrate 16 having coated photosensitive resist to be exposed is exposed again.

Here, in order to enable the light to reach the lower surface of the mask plate 5 vertically and upward.

When the angle between the upper waist plane 201 and the of the lower base plane 202 of the isosceles trapezoid lens 2 is "b," the angle between the light reflected upward by the reflecting mirror 8 and the normal of the upper waist plane 201 is "c," and the refractive index of the upper waist plane 201 is "n," c=arcsin(cos b/n) should be satisfied; the intersection angle of the reflecting mirror and the horizontal level is "a" and 2a=b+c. That is to say, above mentioned conditions can be satisfied by adjusting the angle between the light incident 6 from the second illumination light source S2 and the reflecting mirror 8, so that the light can vertically strike on the lower surface of mask plate 5.

In the exposure apparatus according to the embodiment of the present invention, when performing a first exposure process, light vertically strikes on the upper surface of the mask plate from above, passes through the completely light transmitting region of the mask plate, and then strikes on the substrate having photosensitive resist layer coated thereon to be exposed; when performing a second exposure process, without replacing the mask plate, light vertically strikes on the lower surface of the mask plate from beneath and then is reflected downward onto another substrate photosensitive resist to be exposed by the light reflecting region located in the lower surface of the mask plate; as a result, the two photosensitive resist layers on different substrates or same one substrate can be exposed by same one mask plate. Therefore, it is unnecessary to change mask plate for every exposure process. Costs of designing, purchasing and maintaining mask plates are reduced, the manufacturing cost is also reduced, and the productivity is enhanced.

In the exposure apparatus according to another embodiment of the present invention, there is provided only one illumination light source, light from which is guided through different light path for using in the first and second exposing processes, respectively.

Figure 3:
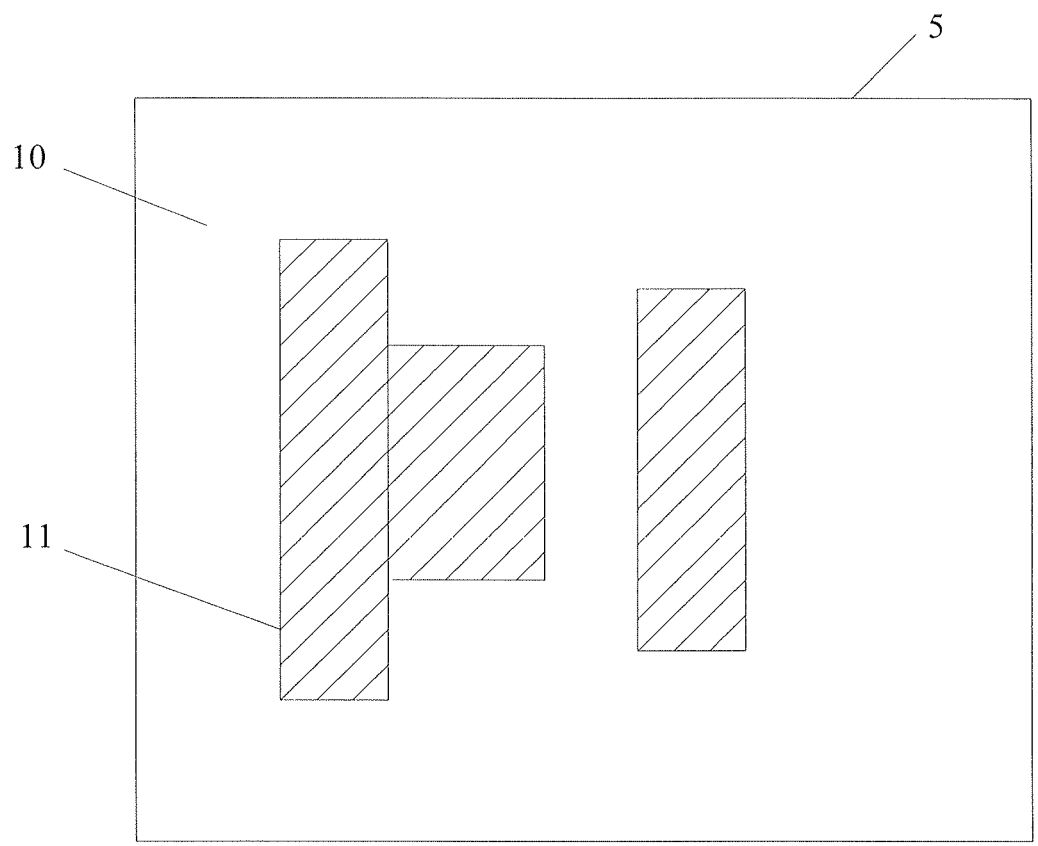
FIG. 3 is a top view of the mask plate.
Figure 4:
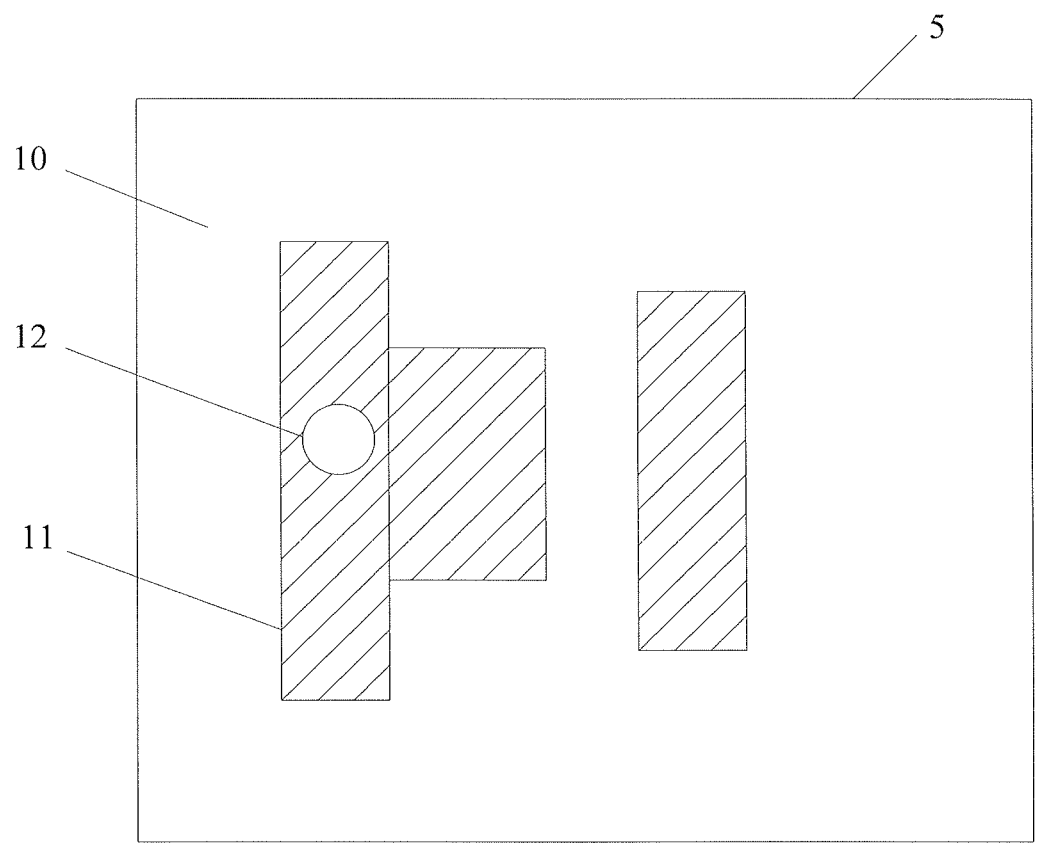
FIG. 4 is a bottom view of the mask plate.

An example of the mask plate 5 according to the embodiment of the present invention is shown in FIG. 3 and FIG. 4. FIG. 3 is a top view of the mask plate 5. The mask plate 5 comprises a completely light transmitting region 10 and a light absorbing region 11. When light vertically strikes on the upper surface of the mask plate 5 from above, the light can pass through the completely light transmitting region 10 and then reach the substrate having photosensitive resist layer coated thereon to be exposed so as to form a required pattern, while the light striking on the light absorbing region 11 cannot pass through the mask plate 5 and is absorbed.

FIG. 4 is a bottom view of the mask plate 5. Also, the mask plate 5 comprises a completely light transmitting region 10 and a light absorbing region 11 on the side of the mask plate which faces the substrate. Furthermore, a light reflecting region 12 is provided in the light absorbing region 11. When light vertically strikes on the bottom surface of the mask plate 5, only the part of light that strikes on the light reflecting region 12 is reflected back and then reaches on the substrate having photosensitive resist layer coated thereon to be exposed to form a required pattern, the other part of the light either passes through the completely light transmitting region 10 or is absorbed by the light absorbing region 11.

By using the mask plate according to the present invention, when performing the first exposure process, light vertically strikes on the upper surface of the mask plate from above, passes through the completely light transmitting region of the mask plate, and then strikes on the substrate having photosensitive resist layer coated thereon to be exposed; when performing the second exposure process, without replacing the mask plate, light vertically strikes on the lower surface of the mask plate from beneath and then is reflected downward to another substrate having photosensitive resist layer coated thereon to be exposed by the light reflecting region located in the lower surface of the mask plate; as a result, the two photosensitive resist layers on different substrates or same one substrate can be exposed by same one mask plate. Therefore, it is unnecessary to change mask plate for every exposure process. Costs of designing, purchasing and maintaining mask plates are reduced, that is to say, the manufacturing cost is reduced, and the productivity is enhanced.

Another embodiment of the present invention provides an exposing method, which comprises the following steps.

S501, placing a first substrate applied with a first photosensitive resist layer under a mask plate, the first substrate being parallel to the mask plate.

S502, turning on the first illumination light source and letting light from the first illumination light source vertically strike on the upper surface of the mask plate from above, pass through a completely light transmitting region of the mask plate, and then strike on the first photosensitive resist layer via a lens device;

S503, turning off the first illumination light source;

S504, placing a second substrate coated with a second photosensitive resist layer under the mask plate, the second substrate being parallel to the mask plate;

S505, turning on a second illumination light source and letting light from the second illuminating light vertically strike on the lower surface of the mask plate through the lens device, then reflected by a light reflecting region located in the lower surface of the mask plate, and finally strike on the second photosensitive resist layer via the lens device. The light reflecting region is provided within the light absorbing region on the side of the mask plate surface which faces the substrate. The first and second substrate can be a same substrate.

Here, the lens device of this embodiments can be the same as that of other embodiments mentioned above, comprising an isosceles trapezoid lens, a concave lens and a convex lens, in which the upper base plane and the lower base plane of the isosceles trapezoid lens are vertical to the mask plate. The concave lens and the convex lens are arranged on the side of the upper base plane of the isosceles trapezoid lens; a light reflecting device, which for example is a reflecting mirror, is provided in the lens device.

If the angle between the upper waist plane and the of the lower base plane of the isosceles trapezoid lens is "b," the refractive index of the upper waist plane is "n," angle between the light reflected upward by the reflecting mirror and the normal of the upper waist plane is "c," then c=arcsin(cos b/n) is satisfied; the intersection angle of the reflecting mirror and the horizontal level is "a," and 2a=b+c. That is to say, conditions mentioned above can be satisfied by adjusting the angle between the light incident from the second illumination light source and the reflecting mirror, so that the light can vertically strike on the lower surface of mask plate.

Besides, the second illumination light source can be arranged on one side of the substrate and mask plate. Light emitted by from second light illumination source is vertically reflected onto the lower surface of the mask plate.

In particular, in the method provided by this embodiment, for example, when fabricating the mask plate which is used for patterning a data line layer, a light reflecting region corresponding to via holes formed in the passivation on source/drain electrodes of thin film transistors can provided on the back side (i.e. the lower surface) of the pattern on the mask plate corresponding to the drain electrodes. In patterning of the data line layer, the first illumination light source is turned on, and light emitted from the first illumination light source illuminates the mask plate from above to expose the photosensitive resist coated on the substrate and form the patterns including source/drain electrodes and data lines on the substrate in process; then in forming the via holes over drain electrodes, the second illumination light source is turned on and the mask plate is not replaced, light emitted from the second illumination light source is vertically reflected onto the lower surface of the mask plate via a reflecting device, only the part of the light which strikes on the light reflecting region which corresponds to the via holes is reflected onto the substrate having photosensitive resist layer coated thereon and form the pattern of the via holes, while the other parts of the light which strikes on the completely light transmitting region and the light absorbing region is not reflected. In this way, the pattern of via holes can be formed. Thus, a special mask plate for defining via holes can be omitted, and the time for changing and checking the mask plate can also be omitted.

In the exposing method according to another embodiment of the present invention, light from only one illumination light source is guided through different light path for using in the first and second exposing processes, respectively.

By using the exposing method according to the embodiment of the present invention, during the first exposure process, light vertically strikes on the upper surface of the mask plate from above, passes through the completely light transmitting region of the mask plate, and then strike on the substrate having photosensitive resist layer coated thereon to be exposed which is provided under the mask plate; during the second exposure process, without replacing the mask plate, light vertically strikes on the lower surface of the mask plate from beneath and then is reflected downward to the substrate having photosensitive resist layer coated thereon to be exposed by the light reflecting region located on the lower surface of the mask plate, so that the two photosensitive resist layers are exposed by same one mask plate. Therefore, it is unnecessary to change the mask plate for every one exposing process. Costs of designing, purchasing and maintaining mask plates are reduced, that is to say, the manufacturing cost is reduced, and the productivity is enhanced.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A mask plate, comprising:
   a light transmitting region configured for making an incident light pass through the mask plate;
   a light absorbing region; and
   a light reflecting region, wherein the light reflecting region is provided in the light absorbing region on one side of the mask plate.

2. An exposing method by using the mask plate of claim 1, comprising:
   placing a first substrate coated with a first photosensitive resist layer under the mask plate, the first substrate being parallel to the mask plate;
   having first light vertically strike on an upper surface of the mask plate from above, pass through the light transmitting region of the mask plate, and then strike on the first photosensitive resist layer to make the first photosensitive resist layer exposed;
   placing a second substrate coated with a second photosensitive resist layer under the mask plate, the second substrate being parallel to the mask plate; and
   having second light reflected by the lens device onto the surface of the mask plate on which the light reflecting region is provided, then reflected by the light reflecting region and strike on the second photosensitive resist layer to make the second photosensitive resist layer exposed.

3. The mask plate according to claim 1, wherein the light absorbing region is provided on both sides of the mask plate.

* * * * *